US009116699B2

(12) United States Patent  
Chen et al.

(10) Patent No.: US 9,116,699 B2  
(45) Date of Patent: Aug. 25, 2015

(54) MEMORY REFRESH RATE THROTTLING FOR SAVING IDLE POWER

(71) Applicant: LENOVO ENTERPRISE SOLUTIONS (SINGAPORE) PTE. LTD., New Tech Park (SG)

(72) Inventors: Jenseng J S Chen, Taipei (TW); Yen Shin Lee, Taipei (TW); Hawk T L Lin, Taipei (TW); Jack Chih Jen Lin, Taipei (TW); Daniel C H Weng, Taipei (TW)

(73) Assignee: Lenovo Enterprise Solutions (Singapore) PTE. LTD., New Tech Park (SG)

( * ) Notice: Subject to any disclaimer, the term of this patent is extended or adjusted under 35 U.S.C. 154(b) by 347 days.

(21) Appl. No.: 13/663,577

(22) Filed: Oct. 30, 2012

(65) Prior Publication Data

US 2013/0111239 A1 May 2, 2013

(30) Foreign Application Priority Data

Oct. 31, 2011 (TW) .............................. 100139653 A

(51) Int. Cl.
*G06F 1/00* (2006.01)
*G06F 1/32* (2006.01)
*G06F 13/16* (2006.01)

(52) U.S. Cl.
CPC ............ *G06F 1/3275* (2013.01); *G06F 1/3203* (2013.01); *G06F 1/3225* (2013.01); *G06F 13/1668* (2013.01); *G06F 2212/1028* (2013.01); *G11C 2211/4067* (2013.01); *Y02B 60/1228* (2013.01)

(58) Field of Classification Search
CPC . G06F 1/3203; G06F 1/3225; G06F 13/1668; G06F 2212/1028
USPC .................. 713/300, 320, 322, 323; 711/106; 714/6.1, 6.2
See application file for complete search history.

(56) References Cited

U.S. PATENT DOCUMENTS

| | | | |
|---|---|---|---|
| 6,134,167 | A | 10/2000 | Atkinson |
| 6,662,278 | B1 | 12/2003 | Kahn et al. |
| RE43,223 | E * | 3/2012 | Stimak et al. ................. 365/222 |
| 2003/0227567 | A1 | 12/2003 | Plotnick et al. |
| 2006/0174142 | A1 | 8/2006 | Lin et al. |
| 2010/0250981 | A1 | 9/2010 | Pamley et al. |
| 2011/0022857 | A1 | 1/2011 | Nussbaum et al. |

FOREIGN PATENT DOCUMENTS

| | | |
|---|---|---|
| TW | 485281 | 5/2002 |
| TW | I316657 | 11/2009 |
| TW | 201128347 | 8/2011 |

* cited by examiner

*Primary Examiner* — Michael J Brown
(74) *Attorney, Agent, or Firm* — Katherine Brown

(57) ABSTRACT

A computer system maintains a threshold value, wherein the threshold value indicates a period of time. The computer system determines that a processor is in any one of a plurality of low power consumption states. Responsive to a determination that the processor is in any one of the plurality of low power consumption states, the computer system increments a counter. The counter indicates the period of time the processor has been in any one of the plurality of low power consumption state. The computing system determines that the counter value is equal to or greater than the threshold value. Responsive to a determination that the counter value is equal to or greater than the threshold value, the computer system sends a first indication to a memory module indicating to the memory module to reduce the memory module refresh rate.

17 Claims, 2 Drawing Sheets

MEMORY REFRESH RATE THROTTLING FOR SAVING IDLE POWER

RELATED APPLICATIONS

In accordance with 35 U.S.C. §119, this application claims the priority benefit of Taiwan Application No. 100139653 filed Oct. 31, 2011.

BACKGROUND

The present inventive subject matter relates to a memory control system for use in a computer system.

At present, it is imperative for system designers to manage power consumption of a computer system, regardless of whether it is a personal computer or a high-level server. In general, computer systems rely mostly upon a common power supply, have their power consumption controlled by a conventional baseboard management controller in real time, and perform acceleration control or throttling control on a processor or a memory, so as to ensure that power consumption of the computer system in high use will not overload the power supply.

SUMMARY

The present inventive subject matter provides in one aspect thereof a memory control system and a computer system having the memory control system. In particular, the memory control system controls a memory to thereby reduce the power consumption of the memory while the computer system is in low use.

By contrast, a conventional power consumption management is focused on preventing the power consumption of a control system from exceeding a safe load allowed by the system. That is to say, it is applicable to a system in high use. For example, the conventional art discloses monitoring system temperature in a manner that system overheating is regarded as an emergency that necessitates throttling a system component by means of power consumption management.

By contrast, the present inventive subject matter does not apply to a system in high use. The present inventive subject matter is, in an aspect thereof, intended to cater for a low-use scenario and is advantageously characterized by throttling a memory of a system in low use appropriately so as to avoid a waste of energy, because a system in low use usually has a reduced requirement for memory access. In another aspect, the present inventive subject matter provides a way of determining whether a system is in low use and then determining whether to throttle a memory of the system.

According to an embodiment of the present inventive subject matter, the present inventive subject matter provides a memory control system for use in a computer system. The memory control system comprises a controller. The computer system comprises a processor and a memory module. After detecting that the processor is in a low power consumption state, the controller sends a throttling signal to the memory module to reduce power consumption of the memory module. According to another embodiment of the present inventive subject matter, the computer system comprises a processor, a memory module, and a memory control system.

Embodiments of the inventive subject matter include a method of reducing the refresh rate of a memory module to reduce power consumption. The computer system maintains a threshold value. The threshold value indicates a period of time. The computer system determines that a processor is in any one of a plurality of low power consumption states. In response to a determination that the processor is in any one of the plurality of low power consumption states, the computer system increments a counter. The counter indicates the period of time the processor has been in a low power consumption state. The computer system determines that the counter value is equal to or greater than the threshold value. Responsive to a determination that the counter value is equal to or greater than the threshold value, the computer system sends an indication to a memory module indicating that the memory module refresh rate should be reduced.

Reference throughout this specification to features, advantages, or similar language does not imply that all of the features and advantages that may be realized with the present inventive subject matter should be or are in any single embodiment of the inventive subject matter. Rather, language referring to the features and advantages is understood to mean that a specific feature, advantage, or characteristic described in connection with an embodiment is included in at least one embodiment of the present inventive subject matter. Thus, discussion of the features and advantages, and similar language, throughout this specification may, but do not necessarily, refer to the same embodiment.

Furthermore, the described features, advantages, and characteristics of the inventive subject matter may be combined in any suitable manner in one or more embodiments. One skilled in the relevant art will recognize that the inventive subject matter may be practiced without one or more of the specific features or advantages of a particular embodiment. In other instances, additional features and advantages may be recognized in certain embodiments that may not be present in all embodiments of the inventive subject matter.

BRIEF DESCRIPTION OF THE DRAWINGS

A more particular description of the inventive subject matter briefly described above will be rendered by reference to specific embodiments that are illustrated in the appended drawings. Understanding that these drawings depict only some embodiments of the inventive subject matter and are not therefore to be considered to be limiting of its scope, the inventive subject matter will be described and explained with additional specificity and detail through the use of the accompanying drawings.

DESCRIPTION OF EMBODIMENT(S)

System Framework

Figure 1:
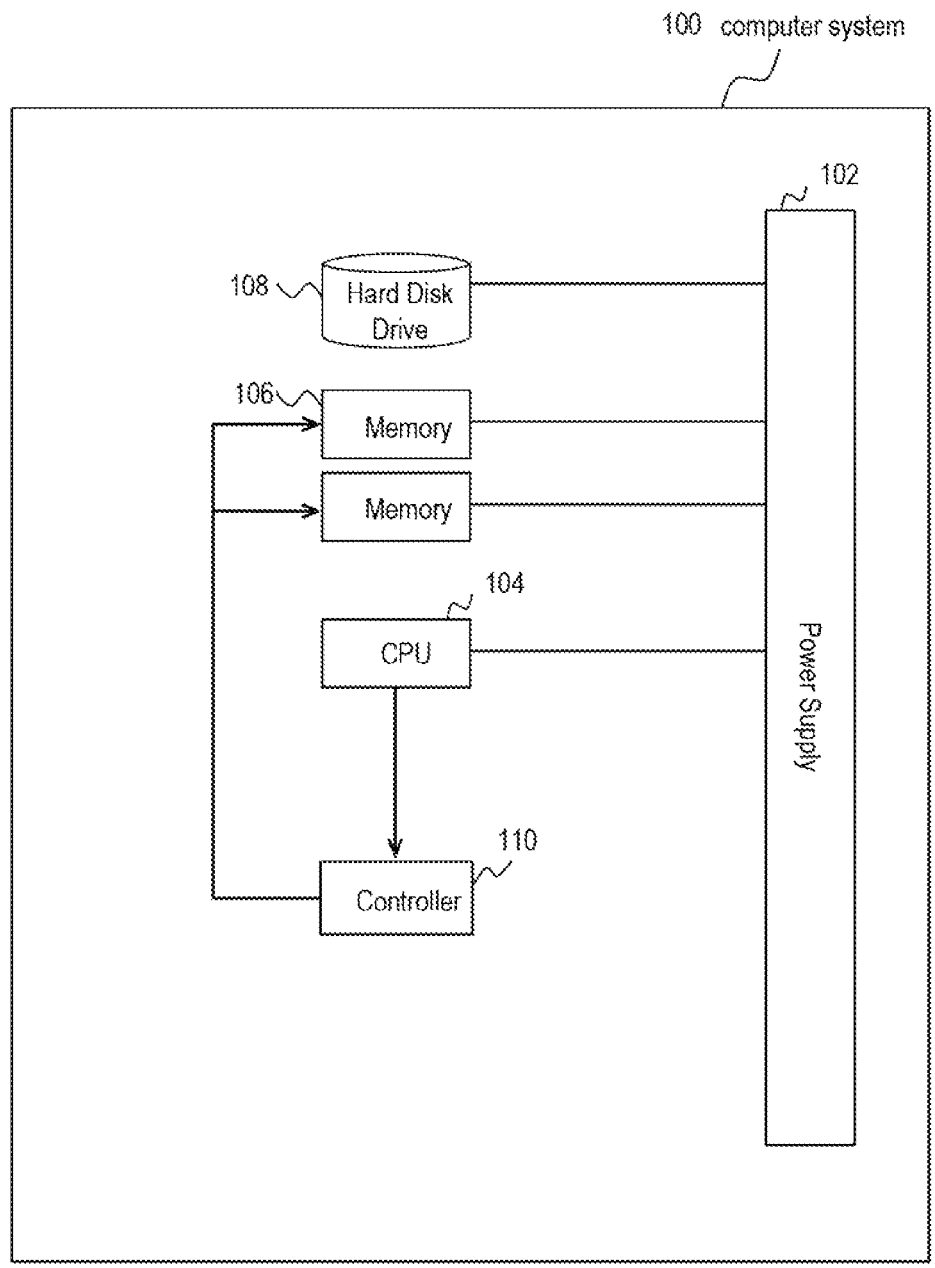
FIG. 1 is a schematic view of a computer system according to a specific embodiment of the present inventive subject matter.

FIG. 1 shows a hardware framework of a computer system 100 in an embodiment. The computer system 100 comprises a power supply 102, a CPU 104, a memory module 106, a hard disk drive 108, and a controller 110. Other basic frameworks and components of the computer system 100 are identical to conventional ones of a typical personal computer or server, such as IBM's System X. Blade (Center or eServer server and thus they are not described in detail for the sake of brevity.

In an embodiment, the operating system (not shown) of the computer system 100 comprises ACPI (Advanced Configuration and Power Interface), and the operation of the CPU 104 meets ACPI Specification (i.e., ACPI Spec. compatible.) For details of ACPI, go to the webpage http://www.acpi.info/ spec.htm which describes Advanced Configuration and Power Interface (ACPI) Specification.

According to ACPI Specification, in the G0 working state, the power state (also known as C state) of the system processor 104 is either an active state (which means that execution is underway) or a sleep state (which means that no execution is taking place). The power state of the processor 104 is configured and denoted by C0, C1, C2, C3. The power state C0 is an active state in which the processor 104 executes an instruction. The power states C1, C2, C3 are each a low power consumption state (or known as a sleep state) of the processor 104. Unlike the power state C0, an ascent that goes through the power state C1, C2, C3 is accompanied by gradual reduction in power consumption of the processor 104 and heat released therefrom.

In yet another aspect, to deal with the situation where the processor 104 is in the power state C0 (i.e., active state), ACPI Specification defines performance states (P state) P0, P1, P2, P3 of the processor 104, wherein, when operating in the state P0, the processor 104 features the maximum voltage level or frequency which decreases in the course of transition from a high-level performance state to a low-level performance state.

In an embodiment of the present inventive subject matter, the processor 104 will be deemed operating in a low power consumption state, provided that it consumes less power than it does in the performance state P0 during the power state CU; this rule is true, regardless of whether the processor 104 is operating in a high-level power state (C state) or a high-level performance state (P state). However, in other embodiments, a low power consumption state is restricted to high-level performance states (P states).

The controller 110 comprises a microprocessor and a memory (not shown). The microprocessor and the memory can be integrated into a baseboard management controller (BMC) of a motherboard (not shown) on the computer system 100. For instance, reference can be made to Maxim's VSC452 baseboard management controller and ServerEngines' SE-SM4210-P01 baseboard management controller, and U.S. Pat. No. 7,739,461 owned by the applicant of this application, such that further amendment thereto or extension therefrom can lead to a technical solution put forth by the present inventive subject matter. It is also feasible that the controller 110 operates independently of the baseboard management controller.

In an embodiment, the controller 110 has an IPMI (Intelligent Platform Management Interface) interface between the controller 110 and an operating system. Given an instruction from the IPMI, it is feasible to detect the power state or the performance state of the CPU 104.

In another embodiment, the controller 110 has a PECI (Platform Environment Control. Interface) interface. Given an instruction from the PECI, a register (not shown) of the CPU 104 is read by means of general purpose I/O ports, so as to detect the power state or the performance state of the CPU 104. For example, the register of the CPU 104 is a Machine State Register (or known as Model Specific Register, MSR for short). For more details of MSR, please read "Intel® 64 and IA-32 Architectures Software Developer's Manual" published by Intel Corporation, especially the description of Architectural MSRs in the manual. Its other related details are described hereunder.

The memory of the controller 110 stores related parameters and firmware required to control or configure the memory module 106. To throttle the memory module 106, the controller 110 sends an appropriate throttling signal to the memory module 106. In some embodiments, the memory module 106 is a DRAM module, and the controller 110 sends the throttling signal to the DRAM module 106 for reducing the refresh rate of the DRAM module 106, for example, decreasing the refresh rate from 1333/MHz to 1066/MHz or even to 800/MHz, so as to reduce the power consumption of the memory module 106, but the present inventive subject matter is not restrictive of the memory module. For example, it is also feasible for the memory module 106 to be a solid state drive (SSD) in a DIMM form factor. For example, for more details of SATADIMM™, please go to the webpage http://www.vikingmodular.com/products/ssd/satae/satadimm.html. In short, any technical solution whereby a memory module is throttled to reduce power consumption thereof should fall within the scope of the present inventive subject matter.

Figure 2:
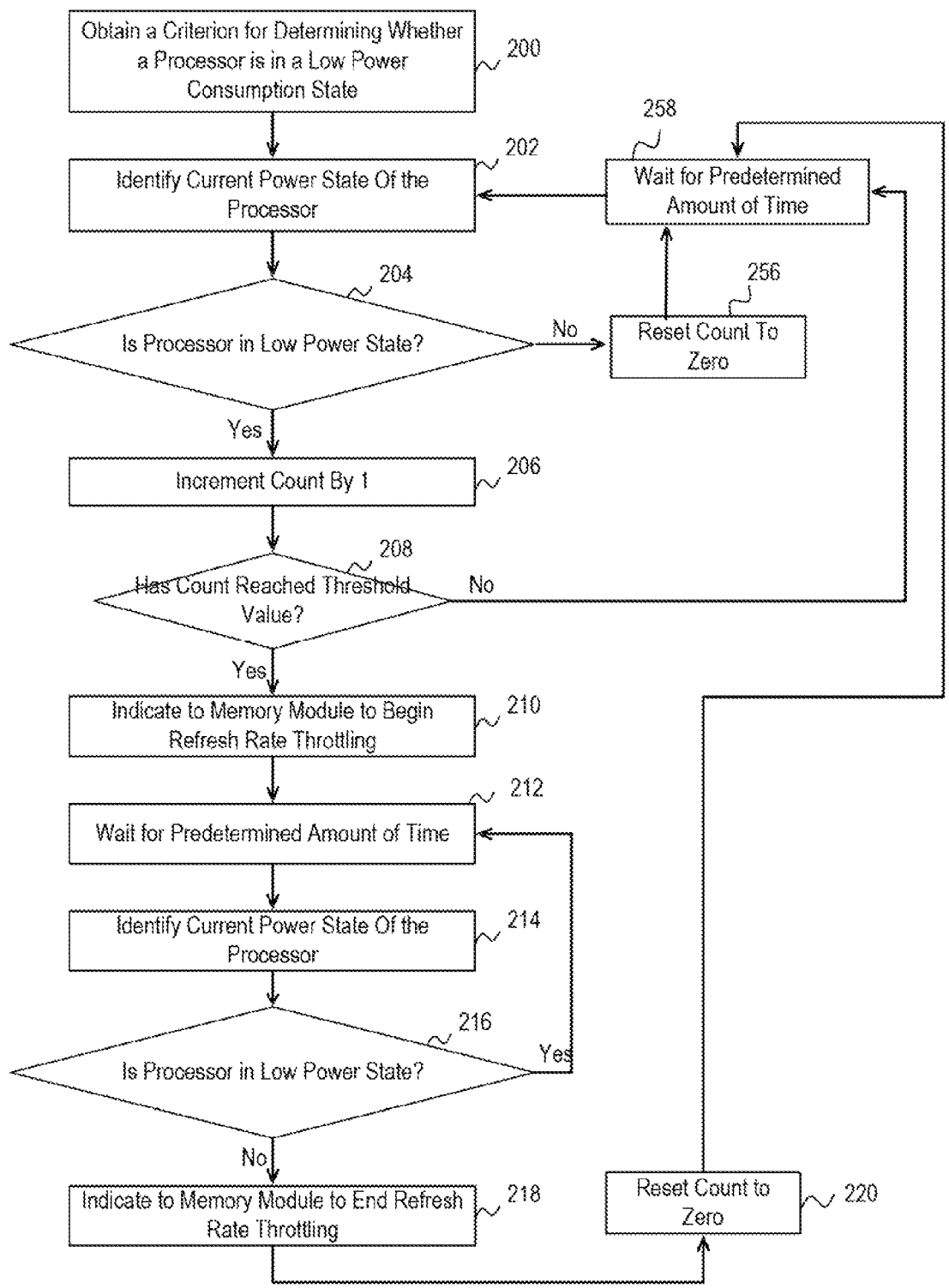
FIG. 2 is a flow chart of a method according to a specific embodiment of the present inventive subject matter.

A memory controlling method of an embodiment of the present inventive subject matter is hereunder described and illustrated with a hardware framework of FIG. 1 and a flow chart of FIG. 2.

Memory Control

Step 200: the controller 110 reads an MSR register (not shown) of the CPU 104 by means of a PECI instruction. Taking the MSR described in "Intel® 64 and IA-32 Architectures Software Developer's Manual" published by Intel Corporation as an example, in this step, the controller 110 reads the value of the field "MSR_0xCE[47:40]" in the MSR register, retrieving the minimum CPU ratio of the CPU 104 and treat it as the criterion for determining that the CPU 104 is in a low power consumption state; however, the aforesaid technical feature is well-known among persons skilled in the art and thus should not limit the present inventive subject matter.

Step 202: similarly to step 200, the controller 110 reads the value of field "MSR_0x198[15:0]" in the MSR register by means of a PECI instruction, so as to retrieve the current CPU ratio of the CPU 104.

Step 204: the controller 110 compares the value of field "MSR_0xCE[47:40]" and the value of field "MSR 0x198 [15:0]" so as to determine whether the current CPU ratio of the CPU 104 is the minimum CPU ratio, or, in other words, determine whether the CPU 104 is currently in a low power consumption state. If the determination is affirmative, the count of a counter of the controller 110 is increased by 1 (step 206), and then the process flow further entails determining whether the count of the counter of the controller 110 has reached a predetermined threshold value (step 208), such as 10. If it is determined that the count has not reached the predetermined threshold value, the process flow will be inactive for a predetermined period of time (step 258), such as 6 seconds, before going to step 202 to retrieve the current (CPU ratio of the CPU 104.

In another aspect, if the determination in step 204 is negative, the count of the counter of the controller 110 will be reset to zero (step 256), and the process flow will go to step 258 to keep inactive for a predetermined period of time before going to step 202 again to retrieve the current CPU ratio of the CPU 104.

Step 210: if the determination in step 208 is affirmative, it will mean that the controller 110 has detected the CPU 104 operating in a low power consumption state in consecutive instances, and thus it will be safe to allow the controller 110 to send the throttling signal to the memory module 106 for reducing the power consumption of the memory module 106. The determination mentioned in step 208 is not required for the present inventive subject matter, or, in other words, the present inventive subject matter does not require the controller 110 to send the throttling signal on condition that it detects in consecutive multiple instances the CPU 104 operating in a low power consumption state.

Step 212: the process flow remains inactive for a predetermined period of time, such as one second, after the controller 110 has sent a throttling signal to the memory module 106, and then the process flow goes to step 214 and step 216. Step 214 is substantially identical to step 202. Step 216 is substantially identical to step 204. However, their purpose is to determine whether the CPU 104 is still operating in a low power consumption state after the controller 110 has started a throttling mechanism aimed at the memory module 106, so as to prevent the throttling of the memory module 106 from compromising the system operation. If the determination in step 216 is affirmative, the process flow will go back to step 212 to wait. In some embodiments, the waiting time in step 212 is shorter than the waiting time in step 258. That is to say, after the throttling mechanism aimed at the memory module 106 has been started, it is determined more often than before whether the CPU 104 is still operating in a low power consumption state. If the determination in step 216 is negative, it will mean that the CPU 104 is no longer in a low power consumption state, and then the process flow will go to step 218.

Step 218: since the CPU 104 is no longer in a low power consumption state, the controller 110 sends a de-throttling signal to the memory module 106 to enable the memory module 106 to restore its normal operation mode and meet system needs. Step 218 is followed by step 220 that involves resetting the count of the counter of the controller 110 to zero. Step 220 is followed by step 258 that involves waiting for a period of time.

The flow chart shown in FIG. 2 refers to just one example of the present inventive subject matter. Persons skilled in the art are able to come up with extensions of the description of the flow chart of FIG. 2 readily. For example, in step 200, field "MSR_0xCE[47:40]" in the MSR register can be replaced with any field, including a field which has not yet been defined by Intel Corporation, capable of representing various high-level power states (C states) or high-level performance states (P states) defined by the ACPI Specification, and functioning as the criterion of determining that the CPU 104 is operating in a low power consumption state. Similarly, in step 202, field "MSR_0x198[15:0]" in the MSR register can be replaced with any field, provided that the field represents the present power state of the CPU 104. Furthermore, persons skilled in the art understand that the present inventive subject matter is not limited to using the MSR register of the CPU 104; instead, the scope of the present inventive subject matter covers any scenarios where the controller 110 is capable of detecting the CPU 104 operating in a low power consumption state by means of hardware, software, firmware, or a combination thereof.

The foregoing preferred embodiments are provided to illustrate and disclose the technical features of the present inventive subject matter, and are not intended to be restrictive of the scope of the present inventive subject matter. Hence, all equivalent variations or modifications made to the foregoing embodiments without departing from the spirit embodied in the disclosure of the present inventive subject matter should fall within the scope of the present inventive subject matter as set forth in the appended claims.

What is claimed is:

1. A method comprising:
 maintaining a threshold value, wherein the threshold value indicates a period of time;
 determining that a processor is in any one of a plurality of low power consumption states;
 responsive to determining that the processor is in any one of the plurality of low power consumption states, incrementing a counter, wherein the counter indicates the period of time the processor has been in any one of the plurality of low power consumption states;
 determining that the counter value is equal to or greater than the threshold value; and
 responsive to determining that the counter value is equal to or greater than the threshold value, sending a first indication to a memory module indicating to the memory module to reduce the memory module refresh rate,
 wherein determining that the processor is in any one of the plurality of low power consumption states comprises:
 reading a first value hosted in a first storage location, wherein the first value hosted in the first storage location indicates a first of the plurality of low power consumption states;
 reading a second value hosted in a second storage location, wherein the second value hosted in the second storage location indicates the current power consumption state of the processor, wherein the current power consumption state is any one of the plurality of low power consumptions states; and
 comparing the first value hosted in the first storage location with the second value hosted in the second storage location, wherein the comparison can indicate that the processor is in any one of the plurality of low power consumption states.

2. The method of claim 1, wherein the first storage location comprises a register designated to host a value indicating a first of the plurality of low power consumption states and the second storage location comprises a register designated to host a value indicating the current power consumption state of the processor.

3. The method of claim 1, wherein the first and the second storage locations comprise at least part of a register designated to host values indicating a first of the plurality of low power consumption states and indicating the current power consumption state of the processor.

4. The method of claim 1 further comprising:
 determining that the processor is not in any one of the plurality of low power consumption states; and
 responsive to determining that the processor is not in any one of the plurality of low power consumption states, sending a second indication to the memory module indicating to the memory module to increase the memory module refresh rate.

5. The method of claim 1, wherein the first value hosted in the first storage location indicates a minimum ratio between a clock rate external to the processor and a clock rate internal to the processor and the second value hosted in the second storage location indicates the current ratio between the clock rate external to the processor and the clock rate internal to the processor.

6. A computer program product comprising:
 a non-transitory computer readable storage medium having computer usable program code embodied therewith, the computer usable program code comprising a computer usable program code configured to:
 maintain a threshold value, wherein the threshold value indicates a period of time;
 determine that a processor is in any one of a plurality of low power consumption states;
 responsive to a determination that the processor is in any one of the plurality of low power consumption states, increment a counter, wherein the counter indicates the period of time the processor has been in any one of the plurality of low power consumption states;

determine that the counter value is equal to or greater than the threshold value;

responsive to a determination that the counter value is equal to or greater than the threshold value, send a first indication to a memory module indicating to the memory module to reduce the memory module refresh rate; and determine that a processor is in any one of a plurality of low power consumption states by:

reading a first value hosted in a first storage location, wherein the first value hosted in the first storage location indicates a first of the plurality of low power consumption states;

reading a second value hosted in a second storage location, wherein the second value hosted in the second storage location indicates the current power consumption state of the processor, wherein the current power consumption state is any one of the plurality of low power consumptions states; and comparing the first value hosted in the first storage location with the second value hosted in the second storage location, wherein the comparison can indicate that the processor is in one of the plurality of low power consumption states.

7. The computer program product of claim 6, wherein the first storage location comprises a register designated to host a value indicating a first of the plurality of low power consumption states and the second storage location comprises a register designated to host a value indicating the current power consumption state of the processor.

8. The computer program product of claim 6, wherein the first and the second storage locations comprise at least part of a register designated to host values indicating a first of the plurality of low power consumption states and indicating the current power consumption state of the processor.

9. The computer program product of claim 6 further configured to:

determine that the processor is not in any one of the plurality of low power consumption states; and responsive to a determination that the processor is not in any one of the plurality of low power consumption states, send a second indication to the memory module indicating to the memory module to increase the memory module refresh rate.

10. The computer program product of claim 6, wherein the first value hosted in the first storage location indicates a minimum ratio between a clock rate external to the processor and a clock rate internal to the processor and the second value hosted in the second storage location indicates the current ratio between the clock rate external to the processor and the clock rate internal to the processor.

11. An apparatus comprising:
a processor;
a memory module coupled with the processor;
a memory controller coupled with the processor and the memory module, configured to:
maintain a threshold value, wherein the threshold value indicates a period of time;
determine that a processor is in any one of a plurality of low power consumption states;
responsive to a determination that the processor is in any one of the plurality of low power consumption states, increment a counter, wherein the counter indicates the period of time the processor has been in any one of the plurality of low power consumption states;
determine that the counter value is equal to or greater than the threshold value; and
responsive to a determination that the counter value is equal to or greater than the threshold value, send a first indication to a memory module indicating to the memory module to reduce the memory module refresh rate; and a first storage location designated to host a first value, wherein the first value indicates a first of the plurality of low power consumption states; and a second storage location designated to host a second value, wherein the second value indicates the current power consumption state of the processor, wherein the current power consumption state of the processor is any one of the plurality of low power consumption states.

12. The apparatus of claim 11, wherein the memory controller configured to determine that a processor is in any one of the plurality of low power consumption states is configured to:

read the first value hosted in the first storage location;
read the second value hosted in the second storage location; and
compare the first value with the second value, wherein the comparison can indicate that the processor is in any one of the plurality of low power consumption states.

13. The apparatus of claim 11, wherein the first storage location comprises a first register designated to host a value indicating a first of the plurality of low power consumption states and the second storage location comprises a second register designated to host a value indicating the current power consumption state of the processor.

14. The apparatus of claim 11, wherein the first and the second storage locations comprise at least part of a register designated to host values indicating a first of the plurality of low power consumption states and indicating the current power consumption state of the processor.

15. The apparatus of claim 11 further comprising a counter designated to host the number of time periods the processor has been in any one of the plurality of low power consumption states.

16. The apparatus of claim 11, wherein the memory controller is further configured to:

determine that the processor is not in any one of the plurality of low power consumption states; and responsive to a determination that the processor is not in any one of the plurality of low power consumption states, send a second indication to the memory module indicating to the memory module to increase the memory module refresh rate.

17. The apparatus of claim 11, wherein the first value hosted in the first storage location indicates a minimum ratio between a clock rate external to the processor and a clock rate internal to the processor and the second value hosted in the second storage location indicates the current ratio between the clock rate external to the processor and the clock rate internal to the processor.

* * * * *